US012672328B2

(12) United States Patent
    Tominaga

(10) Patent No.: US 12,672,328 B2
(45) Date of Patent: Jun. 30, 2026

(54) SILICON CARBIDE SEMICONDUCTOR DEVICE

(71) Applicant: Mitsubishi Electric Corporation, Tokyo (JP)

(72) Inventor: Takaaki Tominaga, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 426 days.

(21) Appl. No.: 18/287,466

(22) PCT Filed: Jun. 9, 2021

(86) PCT No.: PCT/JP2021/021890
    § 371 (c)(1),
    (2) Date: Oct. 19, 2023

(87) PCT Pub. No.: WO2022/259409
    PCT Pub. Date: Dec. 15, 2022

(65) Prior Publication Data
    US 2024/0204056 A1      Jun. 20, 2024

(51) Int. Cl.
    H10D 62/832      (2025.01)
    H10D 30/66       (2025.01)
    H10D 62/10       (2025.01)

(52) U.S. Cl.
    CPC ......... H10D 62/8325 (2025.01); H10D 30/66 (2025.01); H10D 62/127 (2025.01)

(58) Field of Classification Search
    CPC ... H10D 62/8325; H10D 62/127; H10D 30/66
    (Continued)

(56) References Cited

U.S. PATENT DOCUMENTS

| | | | |
|---|---|---|---|
| 5,317,184 A | 5/1994 | Rexer | |
| 9,214,458 B2 * | 12/2015 | Hino | .................... H10D 62/157 |

(Continued)

FOREIGN PATENT DOCUMENTS

| | | |
|---|---|---|
| DE | 112018008178 T5 | 9/2021 |
| JP | 2018-010965 A | 1/2018 |
| JP | 2019-071384 A | 5/2019 |

OTHER PUBLICATIONS

International Search Report and Written Opinion mailed on Aug. 24, 2021, received for PCT Application PCT/JP2021/021890, filed on Jun. 9, 2021, 10 pages including English Translation.

(Continued)

*Primary Examiner* — Tu-Tu V Ho
(74) *Attorney, Agent, or Firm* — XSENSUS LLP

(57)          ABSTRACT

A SiC device includes an n-type semiconductor layer provided on a SiC substrate; a p-type first well region is provided in an upper layer part of the semiconductor layer; an n-type first impurity region is provided in an upper layer part of the first well region; a p-type first well contact region is provided in the upper layer part of the first well region and having a side surface joined to the first impurity region; a first contact electrically connected to the first impurity region and the first well contact region and electrically connected to a first main electrode provided over the semiconductor layer; a second well region separated from the first well region; a p-type second well contact region is provided in an upper layer part of the second well region; and a second contact electrically connected to the second well contact region.

18 Claims, 26 Drawing Sheets

(58) Field of Classification Search
USPC ........................................................ 257/77
See application file for complete search history.

(56)                        References Cited

U.S. PATENT DOCUMENTS

| 11,251,300 | B2 * | 2/2022 | Ni ........................ H10D 30/658 |
| 11,276,758 | B2 * | 3/2022 | Shimizu ............. H10D 62/8325 |
| 2015/0084118 | A1 | 3/2015 | Van Brunt et al. |
| 2019/0109215 | A1 | 4/2019 | Yamashita et al. |

OTHER PUBLICATIONS

German Office Action issued Feb. 3, 2026, in corresponding German Patent Application No. 112021007792.9, 19pp.

* cited by examiner

F I G.  1
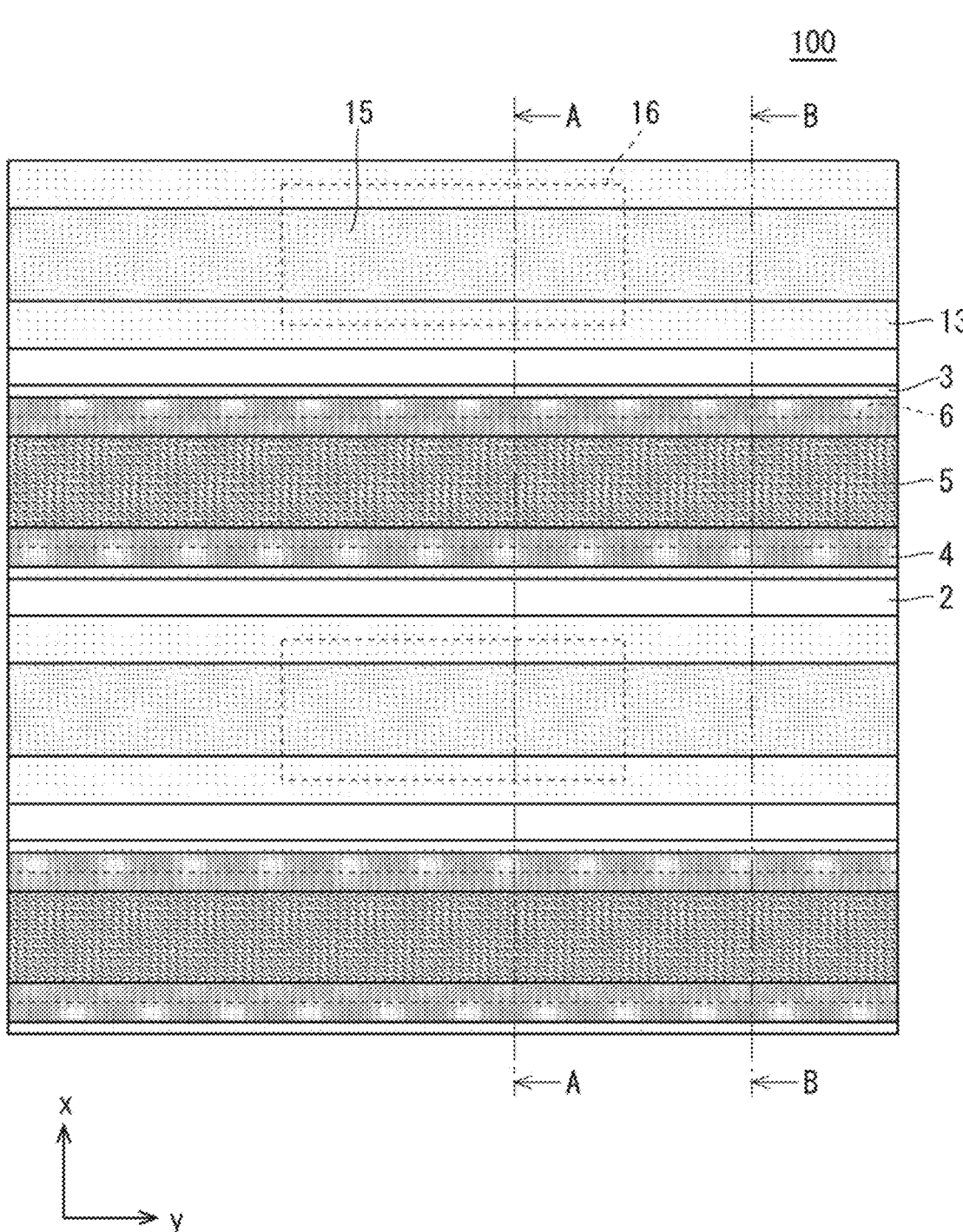

F I G. 2
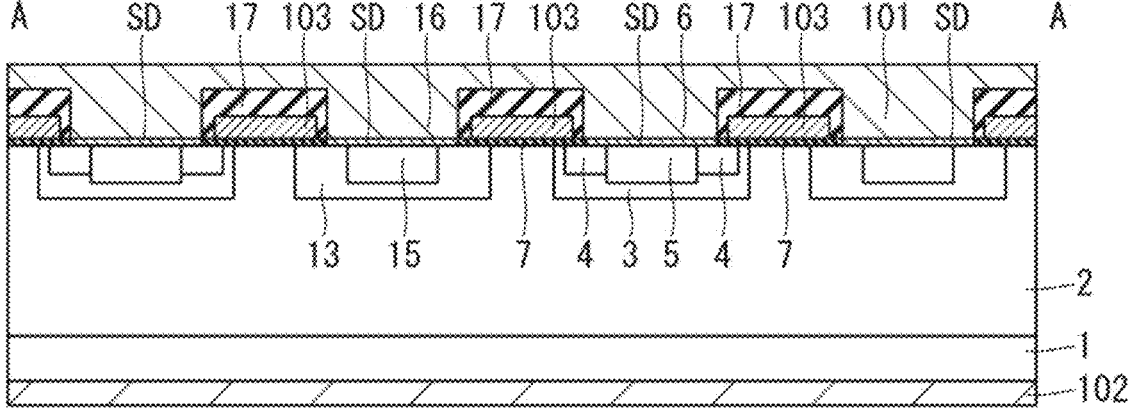

F I G. 4
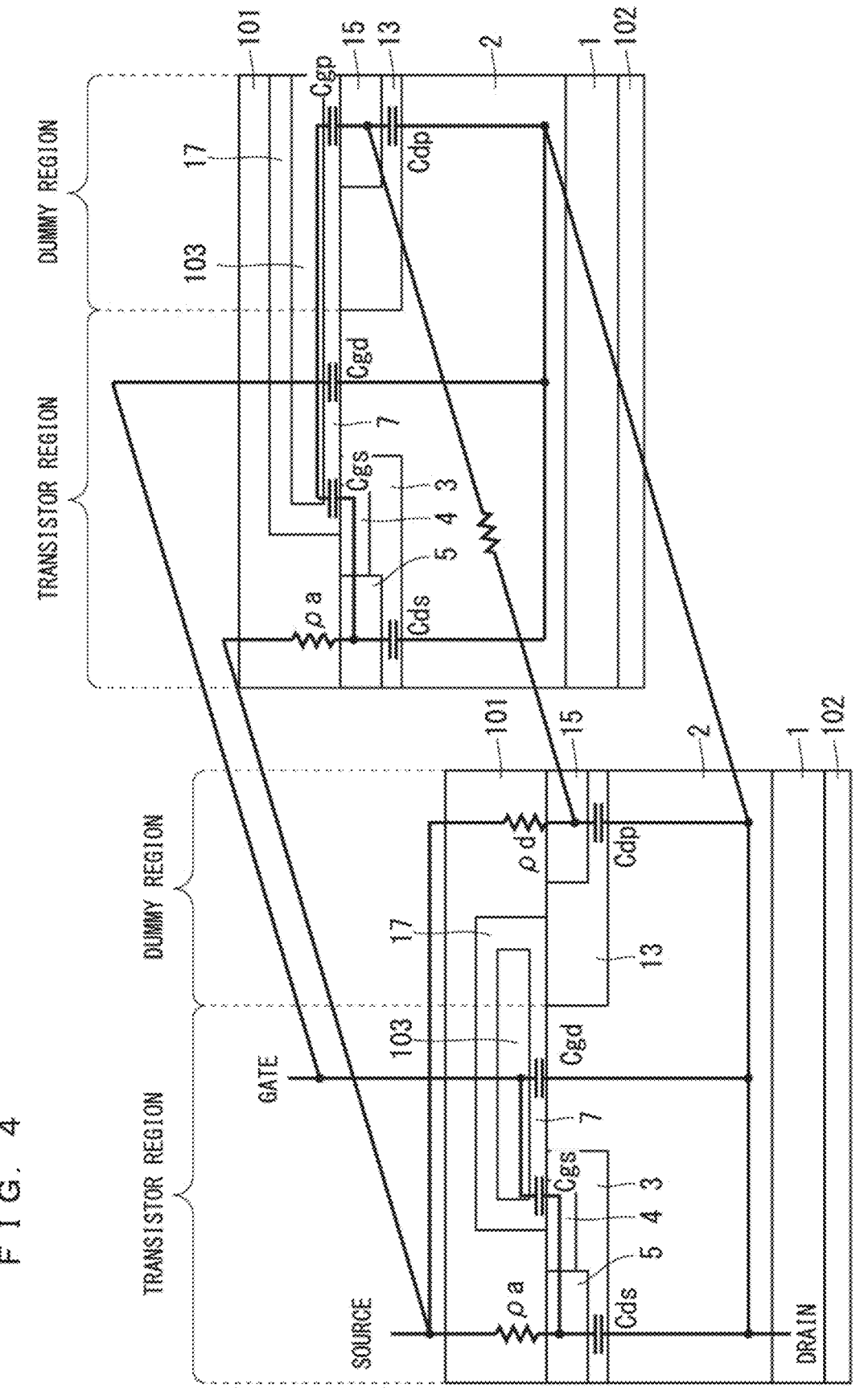

F I G. 5
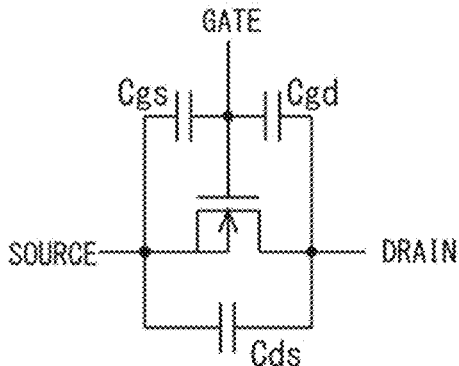

F I G.  6
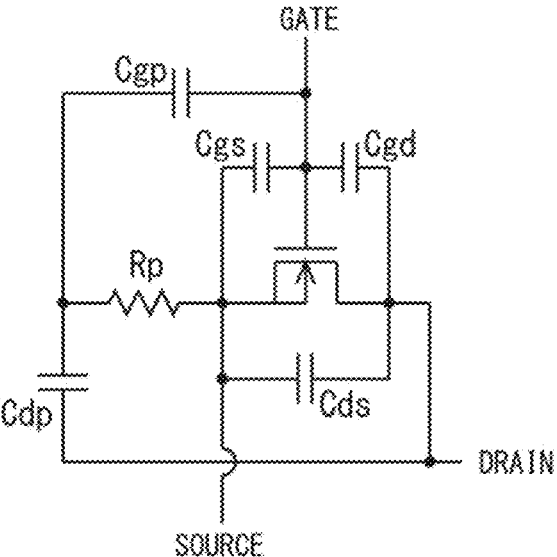

F I G.  7
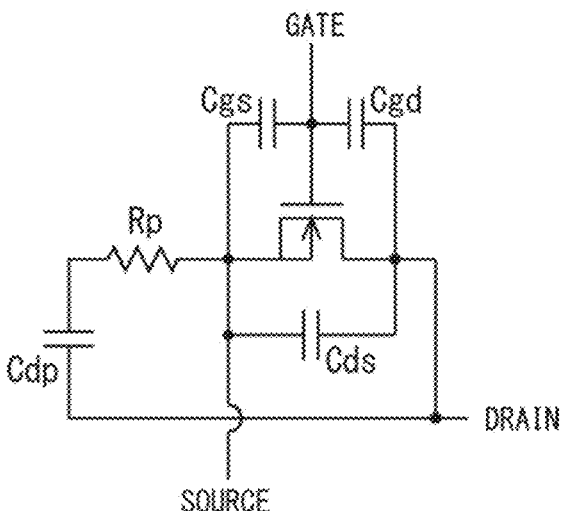

F I G.  8
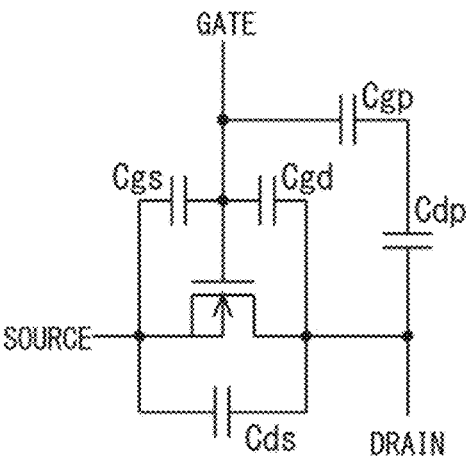

F I G. 9
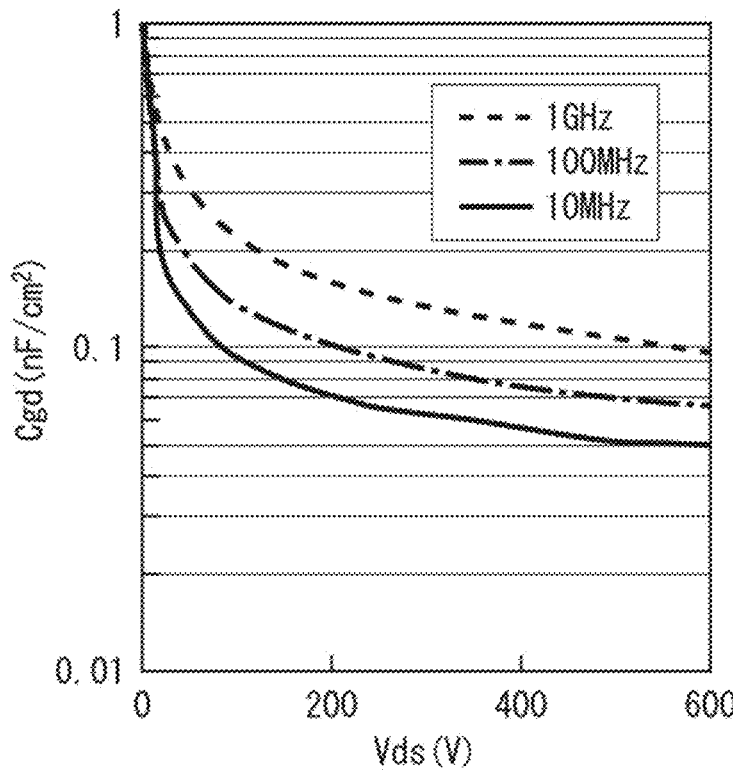

F I G. 1 1
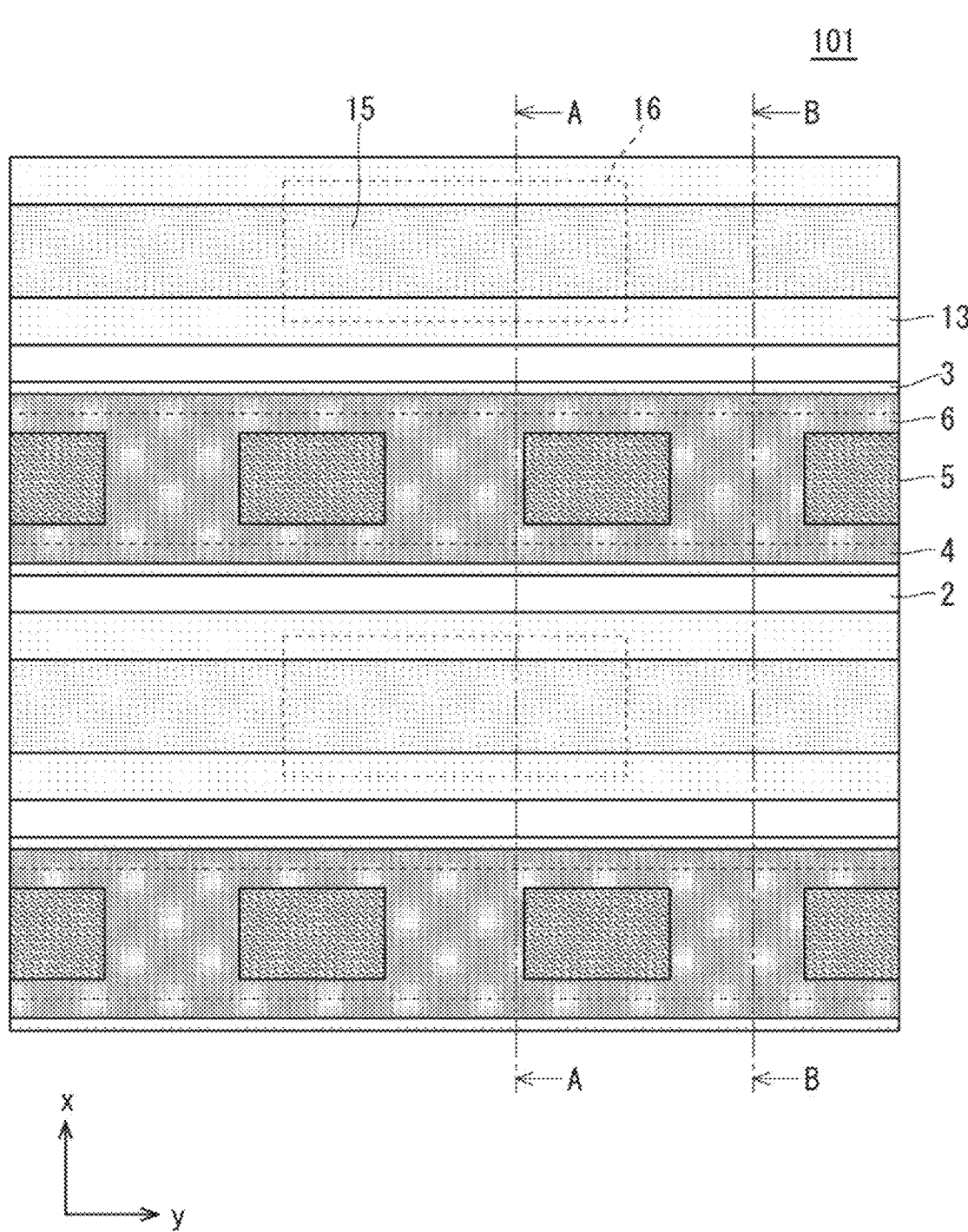

F I G. 1 2
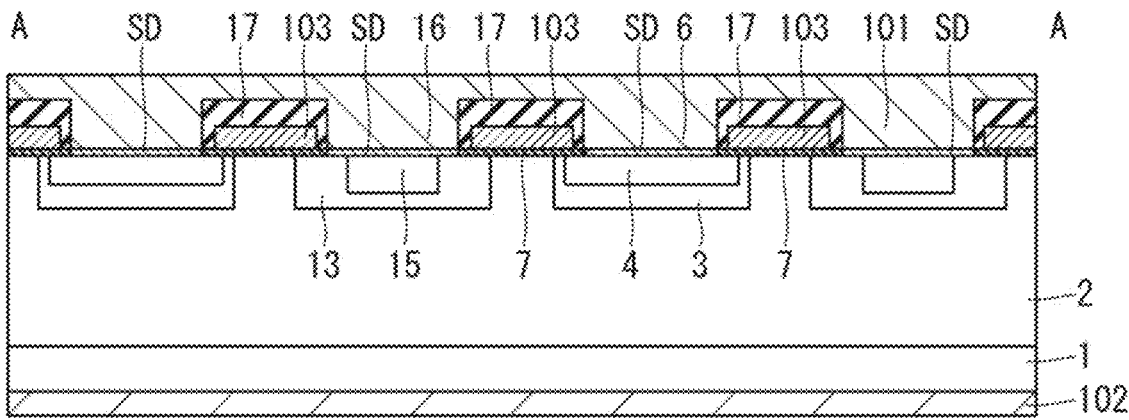

F I G. 1 3
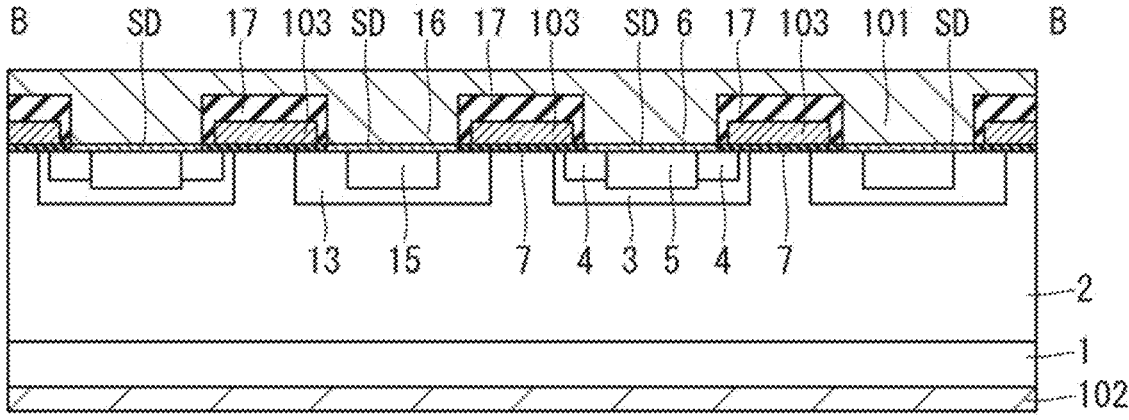

F I G . 1 4
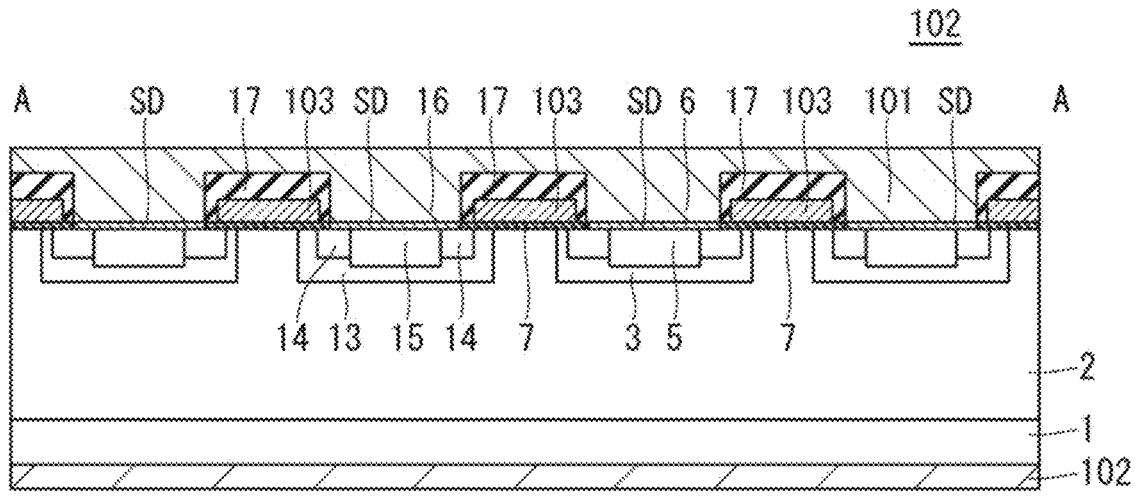

F I G.  1 5
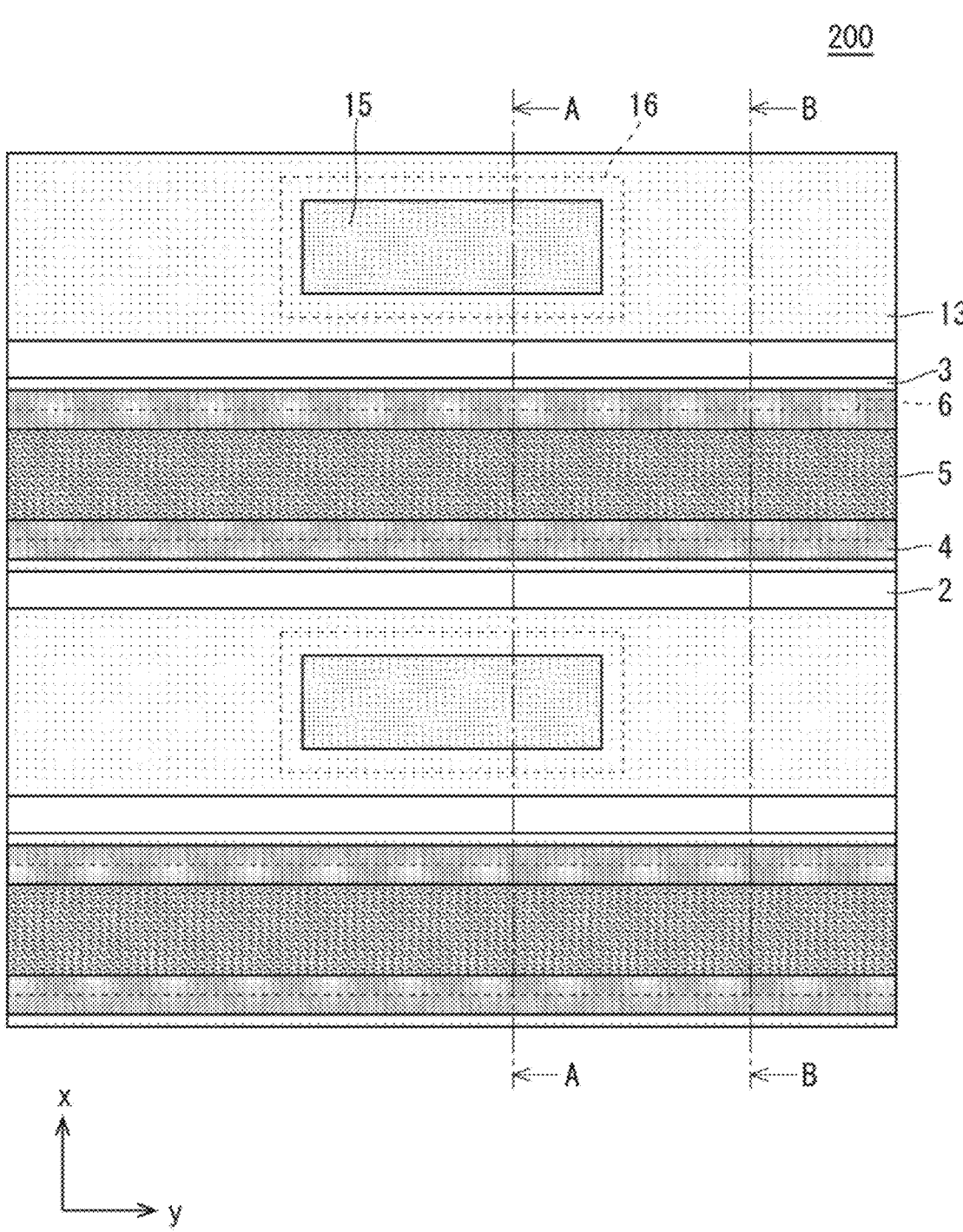

F I G.  1 6
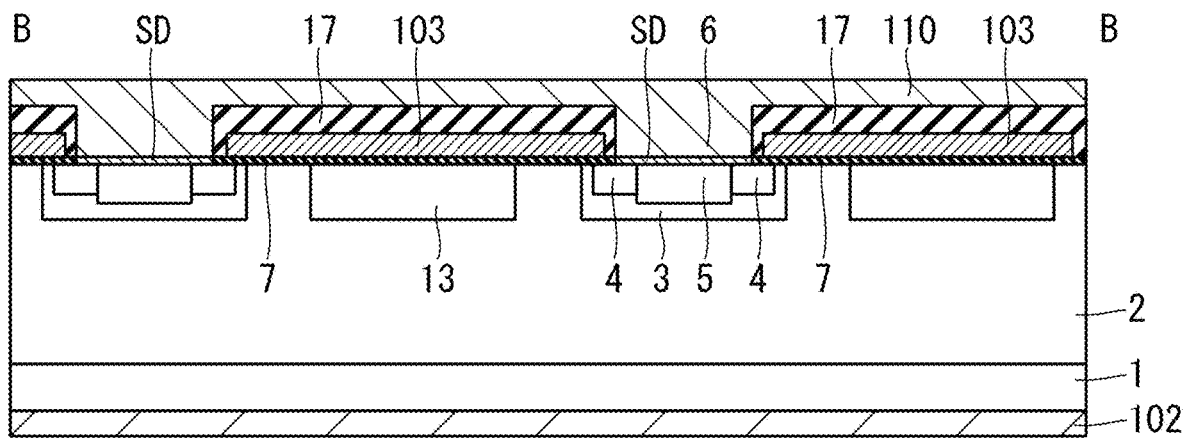

F I G． 1 7
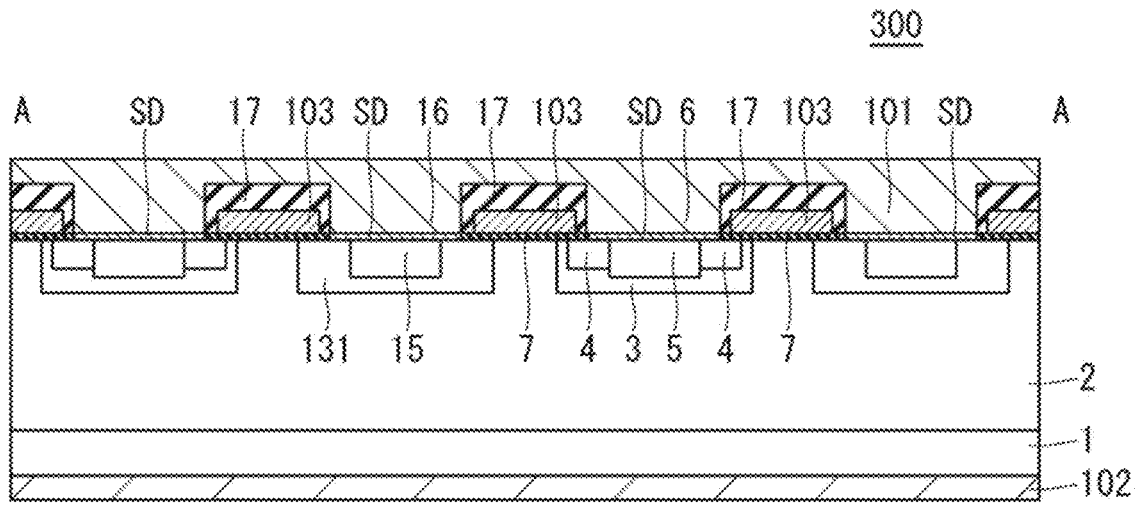

F I G. 1 8
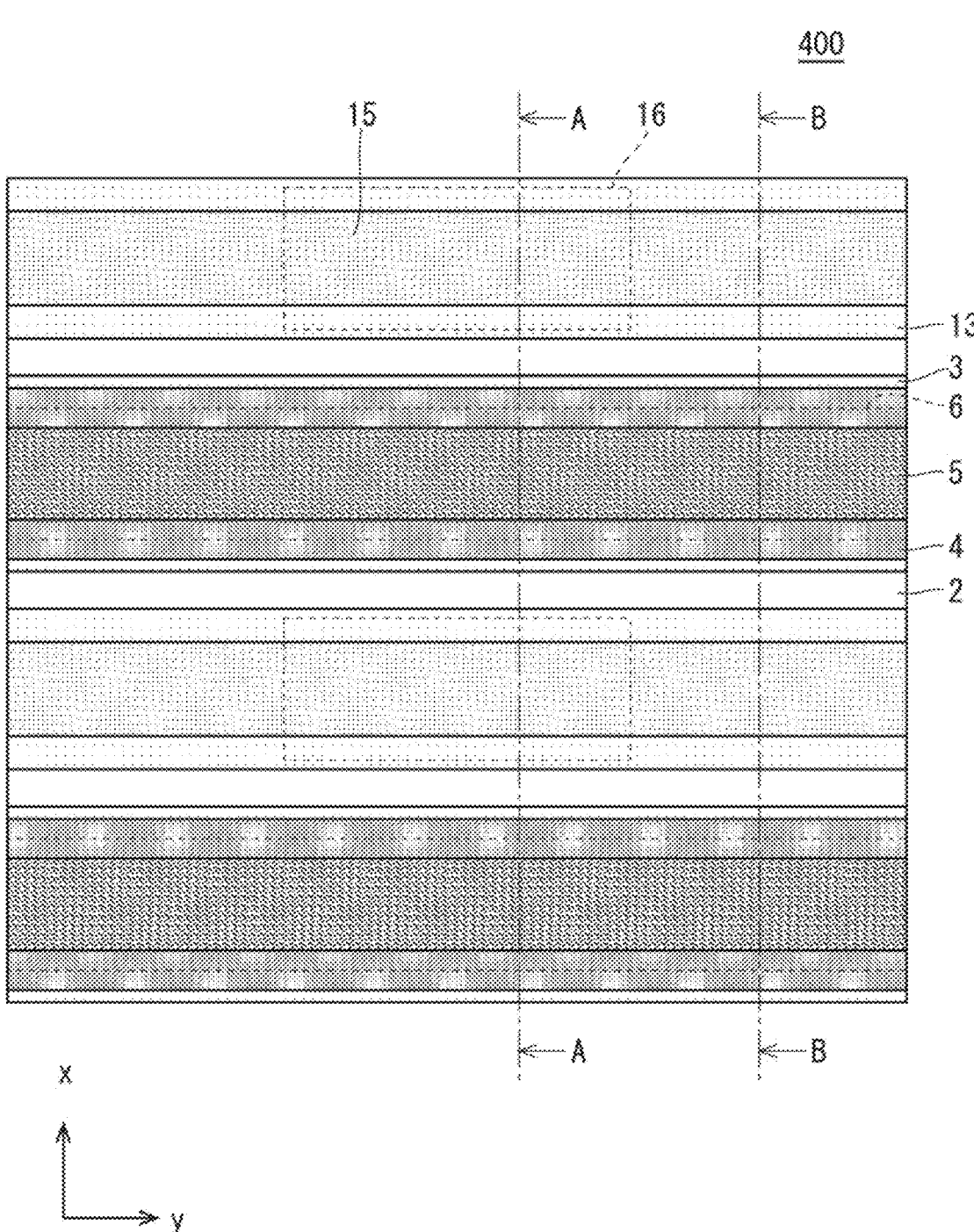

F I G .  2 1
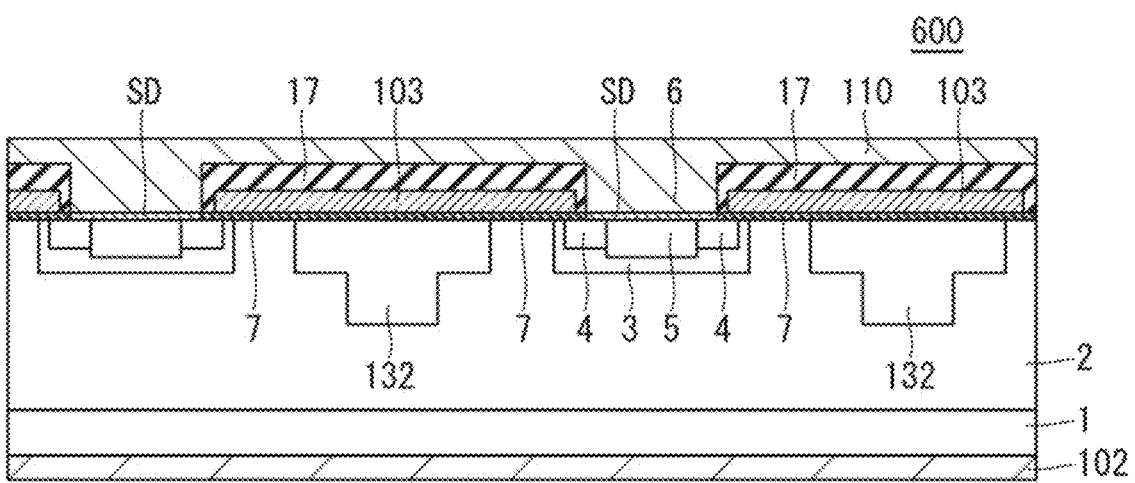

F I G .  2 3
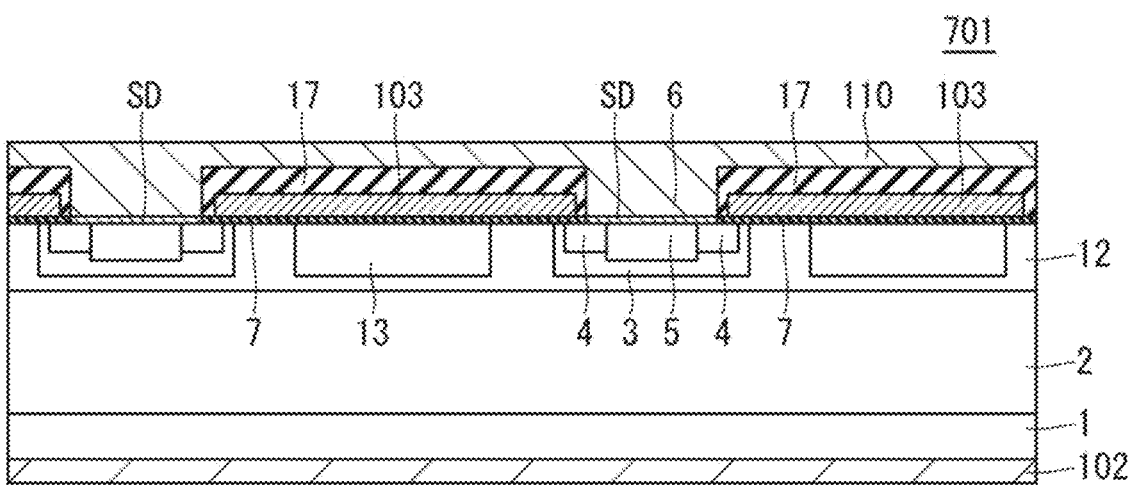

F I G . 2 4
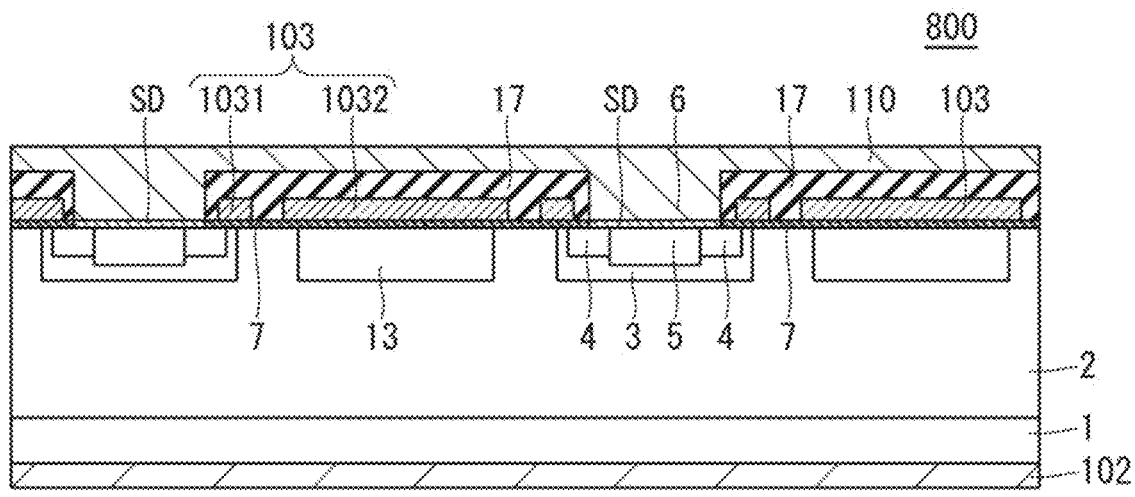

F I G.  2 5                                                       900

F I G.  2 6
1000
15   16
13
3
6
5
4
2
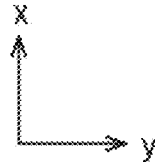

SILICON CARBIDE SEMICONDUCTOR DEVICE

CROSS-REFERENCE TO RELATED APPLICATION

This application is based on PCT filing PCT/JP2021/021890, filed Jun. 9, 2021, the entire contents of which are incorporated herein by reference.

TECHNICAL FIELD

The present disclosure relates to a silicon carbide semiconductor device, particularly to a silicon carbide semiconductor device in which switching loss is suppressed.

BACKGROUND ART

A vertical power semiconductor device is widely employed as a switching element used in a power converter circuit, for example. In particular, a power semiconductor device having an MOS (metal oxide semiconductor) structure is widely employed. Typically, an insulated gate bipolar transistor (IGBT) and an MOSFET (metal oxide semiconductor field effect transistor) are used. By using an n-type MOSFET as a switching element of an inverter circuit that is one of silicon carbide semiconductor devices using silicon carbide as a semiconductor material having a bandgap about three times greater than the bandgap of silicon (Si), it becomes possible to reduce power loss in a power converter circuit.

However, if the n-type MOSFET using silicon carbide is employed in a power converter circuit to be driven at a frequency exceeding several tens of kilohertz, for example, resultant switching loss has a high ratio to total power loss. Hence, it becomes important to reduce switching loss further.

Typically, the n-type MOSFET includes an n-type drift layer and a p-type well provided on the n-type drift layer. When the MOSFET is switched from an on state to an off state, a drain voltage, specifically, a voltage at a drain electrode increases rapidly in the MOSFET to change from substantially 0 V to several hundreds of volts. Then, a displacement current is generated across a parasitic capacitance existing between the p-type well and the n-type drift layer. The displacement current generated on the drain electrode side flows into the drain electrode. The displacement current generated on a source electrode side flows into a source electrode through the p-type well or into the gate electrode through a gate insulating film capacitance. When the MOSFET is switched from an off state to an on state, a displacement current flows through the p-type well in a direction reverse to that in the case of the switching from an on state to an off state.

Driving a switching element at higher speed is required in order to reduce switching loss further. In other words, in order to reduce loss, it is required to further increase dV/dt indicating fluctuation in a drain voltage V with respect to time t and dI/dt indicating temporal fluctuation in a drain current I. As a result, gate-to-source voltage oscillation due to a parasitic capacitance and a parasitic inductance is likely to occur during switching operation, causing increase in electromagnetic noise.

The increase in electromagnetic noise during switching operation is required to be restricted as it might cause malfunction and failure of an external device.

PRIOR ART DOCUMENT

Patent Document

Patent Document 1: Japanese Patent Application Laid-Open No. 2019-71384

SUMMARY

Problem to be Solved by the Invention

According to a technique disclosed in Patent Document 1, an MOSFET having a super junction (SJ) structure includes a first p pillar region extending in a first direction, a first well region provided between the first p pillar region and a first plane, and a second well region separated in the first direction from the first well region. The MOSFET is formed on surface sides of the first well region and the second well region. A gate insulating film and a gate electrode are provided on the first p pillar region between the first well region and the second well region to form a region not to function as a transistor. By doing so, gate-to-source voltage oscillation is suppressed during switching operation.

Meanwhile, part of a displacement current generated in the first p pillar region during switching operation flows into a source electrode through the first well region and the second well region formed on the first p pillar region and further through a contact region formed on the first well region and the second well region, thereby causing voltage fluctuation in the first well region and the second well region. Hence, switching operation is hindered by a displacement current between the first well region, the second well region and the gate electrode, and by substrate effect. This causes a problem of increased switching loss.

The present disclosure has been made to solve the above-described problems, and is intended to provide a silicon carbide semiconductor device in which increase in switching loss is suppressed while gate-to-source voltage oscillation is suppressed during switching operation.

Means to Solve the Problem

A silicon carbide semiconductor device according to the present disclosure is a silicon carbide semiconductor device in which a main current flows in a thickness direction of a silicon carbide substrate, including: a semiconductor layer of a first conductivity type provided on a first main surface of the silicon carbide substrate; a first well region of a second conductivity type provided in an upper layer part of the semiconductor layer and having a stripe shape extending in a first direction; a first impurity region of the first conductivity type provided in an upper layer part of the first well region; at least one first well contact region of the second conductivity type provided in the upper layer part of the first well region and having a side surface joined to the first impurity region; a first contact electrically connected to the first impurity region and the at least one first well contact region and electrically connected to a first main electrode provided over the semiconductor layer; a second well region of the second conductivity type having a stripe shape separated from the first well region in a second direction perpendicular to the first direction, extending in the first direction, and having no impurity region of the first conductivity type inside the second well region; at least one second well contact region of the second conductivity type provided in an upper layer part of the second well region; a second contact electrically connected to the at least one second well contact region and electrically connected to the first main electrode provided over the semiconductor layer; and a second main electrode provided on a second main surface of the silicon carbide substrate on an opposite side to the first main surface, wherein in an area in which the first well region and the second well region are adjacent to each other, a gate electrode is provided across a gate insulating film provided on a peripheral portion of the first impurity region, on the first well region, on the semiconductor layer, and on a peripheral portion of the second well region.

Effects of the Invention

In the silicon carbide semiconductor device according to the present disclosure, it is possible to suppress potential fluctuation in the first well region during switching operation. Thus, increase in switching loss can be suppressed while gate-to-source voltage oscillation is suppressed.

BRIEF DESCRIPTION OF DRAWINGS

FIG. 1 is a plan view schematically showing the configuration of a silicon carbide semiconductor device according to a first embodiment;

FIG. 2 is a sectional view schematically showing the configuration of the silicon carbide semiconductor device according to the first embodiment;

FIG. 4 is a schematic view explaining effect by the silicon carbide semiconductor device according to the first embodiment;

FIG. 5 is a schematic view explaining effect by the silicon carbide semiconductor device according to the first embodiment;

FIG. 6 is a schematic view explaining effect by the silicon carbide semiconductor device according to the first embodiment;

FIG. 7 is a schematic view explaining effect by the silicon carbide semiconductor device according to the first embodiment;

FIG. 8 is a schematic view explaining effect by the silicon carbide semiconductor device according to the first embodiment;

FIG. 9 explains effect by the silicon carbide semiconductor device according to the first embodiment;

FIG. 11 is a plan view schematically showing a configuration of a first modification of the silicon carbide semiconductor device according to the first embodiment;

FIG. 12 is a sectional view schematically showing the configuration of the first modification of the silicon carbide semiconductor device according to the first embodiment;

FIG. 13 is a sectional view schematically showing the configuration of the first modification of the silicon carbide semiconductor device according to the first embodiment;

FIG. 14 is a sectional view schematically showing a configuration of a second modification of the silicon carbide semiconductor device according to the first embodiment;

FIG. 15 is a plan view schematically showing the configuration of a silicon carbide semiconductor device according to a second embodiment;

FIG. 16 is a sectional view schematically showing the configuration of the silicon carbide semiconductor device according to the second embodiment;

FIG. 17 is a sectional view schematically showing the configuration of a silicon carbide semiconductor device according to a third embodiment;

FIG. 18 is a plan view schematically showing the configuration of a silicon carbide semiconductor device according to a fourth embodiment;

FIG. 21 is a sectional view schematically showing the configuration of a silicon carbide semiconductor device according to a sixth embodiment;

FIG. 23 is a sectional view schematically showing a configuration of a modification of the silicon carbide semiconductor device according to the seventh embodiment;

FIG. 24 is a sectional view schematically showing the configuration of a silicon carbide semiconductor device according to an eighth embodiment;

FIG. 25 is a plan view schematically showing the configuration of a silicon carbide semiconductor device according to a ninth embodiment; and FIG. 26 is a plan view schematically showing the configuration of a silicon carbide semiconductor device according to a tenth embodiment.

DESCRIPTION OF EMBODIMENTS

Introduction

Figure 3:
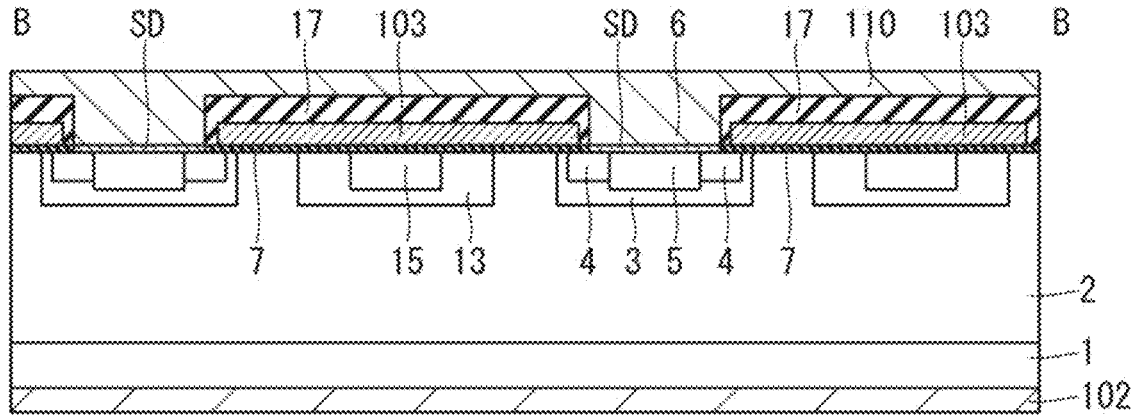
FIG. 3 is a sectional view schematically showing the configuration of the silicon carbide semiconductor device according to the first embodiment.

Note that the drawings are schematically shown, and mutual relationships between sizes and positions of images shown in different drawings are not necessarily accurately illustrated but can be changed as appropriate. In addition, in the following description, comparable constituting elements are denoted by the same reference numerals and shown in the drawings with these numerals. This also applies to the names and the functions thereof. Thus, detailed descriptions thereof may be omitted in some cases. Furthermore, in the present description, expressions such as "on something" and "covering something" do not exclude the presence of any object interposed between constituting elements. For example, if there is a phrase that "B provided on A" or "A covers B," such a phrase may include a configuration in which another element C is provided between A and B, as well as a configuration without the element C. In addition, in the following description, terms meaning specific positions and directions such as "upper," "lower," "side," "bottom," "front," or "rear" may be used. However, these terms are used for the convenience in facilitating understanding of the substances of the embodiments, and are not relevant to the directions in actual implementations.

A "MOS" has traditionally been used to indicate a metal-oxide-semiconductor junction structure. In a MOS field-effect transistor (MOSFET) having a MOS structure, in particular, materials for a gate insulating film and a gate electrode have been improved from the viewpoint of trend toward higher integration, improvement in manufacturing process, etc. in recent years.

For example, as a material for a gate electrode in a MOSFET, polycrystalline silicon has come to be adopted instead of metal, mainly from the viewpoint of forming a source and a drain in a self-aligned manner. Furthermore, from the viewpoint of improving electrical characteristics, a material having a high dielectric constant has come to be used as a material for a gate insulating film. However, this material is not necessarily limited to oxides.

Therefore, use of the term "MOS" is not necessarily limited only to a metal-oxide-semiconductor stacked structure, and such a limitation is also not an assumption of the present description. Specifically, in consideration of general technical knowledge, "MOS" herein has a meaning not only as an abbreviation derived from its etymology but also broadly including conductor-insulator-semiconductor stacked structures.

In the following description, regarding a conductivity type of impurity, an n-type is defined as a "first conductivity type" and a p-type as an opposite conductivity type to the n-type is defined as a "second conductivity type." Conversely, definitions can be such that the "first conductivity type" is the p-type and the "second conductivity type" is the n-type.

Embodiments will be described below on the basis of the drawings. In the following description, parts that are the same or corresponding between the drawings are given the same reference numerals, and the description thereof will not be repeated.

In first to tenth embodiments described below, a vertical n-type MOSFET in which a main current flows in a thickness direction of a substrate will be employed as an example of a silicon carbide semiconductor device.

First Embodiment

In the present disclosure, a vertical n-type silicon carbide MOSFET in which a main current flows in a thickness direction of a substrate will mainly be described as an example of a silicon carbide semiconductor device.

FIG. 1 is a plan view schematically showing the configuration of an n-type silicon carbide MOSFET 100 of a first embodiment according to the present disclosure. As shown in FIG. 1, the n-type silicon carbide MOSFET 100 includes a stripe-shape p-type (second conductivity type) well region 3 (first well region) and a stripe-shape p-type well region 13 (second well region) that extend in a y direction corresponding to a first direction and are formed alternately in an x direction corresponding to a second direction. The well region 3 and the well region 13 are formed separated from each other in the x direction in which the well region 3 and the well region 13 are arranged.

A source region 4 containing a relatively high concentration of n-type (first conductivity type) impurity is formed in the well region 3. A well contact region 5 (first well contact region) containing a relatively high concentration of p-type impurity is further formed in the source region 4. A well contact region 15 (second well contact region) containing a relatively high concentration of the p-type impurity is formed in the well region 13.

A source contact 6 (first source contact) is provided on the source region 4 and the well contact region 5. The source region 4 and the well contact region 5 are electrically connected through the source contact 6 to a source electrode not shown in the drawings. A source contact 16 (second source contact) is provided on the well contact region 15. The well contact region 15 is electrically connected through the source contact 16 to the source electrode not shown in the drawings.

FIG. 2 is a sectional view taken in an arrow direction along a line A-A in FIG. 1 and schematically showing the configuration of a unit cell. As shown in FIG. 2, the n-type silicon carbide MOSFET 100 is provided on a silicon carbide substrate 1 containing a relatively high concentration of the n-type impurity.

The silicon carbide substrate 1 has a first main surface on which a drift layer 2 is provided that is a semiconductor layer containing a relatively low concentration of the n-type impurity. The drift layer 2 is an epitaxial growth layer formed by epitaxial growth, for example.

The p-type well region 3 is provided in an upper layer part of the drift layer 2. The p-type well contact region 5 is selectively provided in an upper layer part of the well region 3. The n-type source region 4 is provided in such a manner as to contact two side surfaces of the well contact region 5.

The well region 3 is formed at a depth from a topmost surface of the drift layer 2 that is greater than a depth of the source region 4 from the topmost surface of the drift layer 2. The well contact region 5 is formed at a depth from the topmost surface of the drift layer 2 that is substantially equal to or greater than the depth of the source region 4 from the topmost surface of the drift layer 2 while not exceeding the depth of the well region 3.

The well region 13 is provided in the upper layer part of the drift layer 2 while separated from the well region 3. The well contact region 15 is selectively provided in an upper layer part of the well region 13. The well contact region 15 is formed at a depth from the topmost surface of the drift layer 2 that does not exceed the depth of the well region 13.

Preferably, the well region 3 and the well region 13 are separated from each other as far as to an element outer periphery. However, effect is not damaged seriously if the well region 3 and the well region 13 are connected to each other only at the element outer periphery.

A gate insulating film 7 is formed on the drift layer 2. A gate electrode 103 is provided on the gate insulating film 7. The gate electrode 103 is provided over the drift layer 2, the well region 3, the well region 13, and a peripheral portion of the source region 4.

An interlayer insulating film 17 is provided on the drift layer 2 including an area on the gate electrode 103. A source contact 6 and a source contact 16 are provided in such a manner as to penetrate the interlayer insulating film 17. The source contact 6 and the source contact 16 each have a bottom where a silicide film SD made of nickel silicide is provided. At the bottom of the source contact 6, the well contact region 5 in its entirety and a part of the source region 4 are covered with the silicide film SD. At the bottom of the source contact 16, the well contact region 15 in its entirety and a part of the well region 13 are covered with the silicide film SD.

The well contact region 5 and the source region 4 are electrically connected to a source electrode 101 through the silicide film SD and the source contact 6. The well contact region 15 is electrically connected to the source electrode 101 through the silicide film SD and the source contact 16. Specifically, the well region 3 and the well region 13 are electrically connected to each other through the source electrode 101.

A drain electrode 102 is provided on a second main surface on an opposite side to the first main surface of the silicon carbide substrate 1.

The silicide film SD is not limited to nickel silicide but aluminum silicide or titanium silicide may be used. The source contact 6 and the source contact 16 can be formed during formation of the source electrode 101 by burying metal as a material for the source electrode 101 such as nickel, aluminum, or titanium, for example, into a contact hole.

Preferably, an impurity concentration of the n-type impurity in the drift layer 2 is equal to or greater than $1.0\times10^{14}$ cm$^{-3}$ and equal to or less than $1.0\times10^{17}$ cm$^{-3}$. Preferably, an impurity concentration of the p-type impurity in the well region 3 is equal to or greater than $1.0\times10^{16}$ cm$^{-3}$ and equal to or less than $1.0\times10^{20}$ cm$^{-3}$. Preferably, an impurity concentration of the p-type impurity in the well region 13 is equal to or greater than $1.0\times10^{16}$ cm$^{-3}$ and equal to or less than $1.0\times10^{20}$ cm$^{-3}$. Preferably, an impurity concentration of the n-type impurity in the source region 4 is equal to or greater than $1.0\times10^{17}$ cm$^{-3}$ and equal to or less than $1.0\times10^{21}$ cm$^{-3}$. Preferably, an impurity concentration of the p-type impurity in the well contact region 5 is equal to or greater than $1.0\times10^{18}$ cm$^{-3}$ and equal to or less than $1.0\times10^{22}$ cm$^{-3}$. Preferably, an impurity concentration of the p-type impurity in the well contact region 15 is equal to or greater than $1.0\times10^{18}$ cm$^{-3}$ and equal to or less than $1.0\times10^{22}$ cm$^{-3}$.

FIG. 3 is a sectional view taken in an arrow direction along a line B-B in FIG. 1 and schematically showing the configuration of a unit cell. In FIG. 3, the configurations of the silicon carbide substrate 1, the drift layer 2, the well region 3, the source region 4, the well contact region 5, the source contact 6, the well region 13, and the well contact region 15 are the same as those of FIG. 2.

As shown in FIG. 3, in the section along the line B-B, the gate insulating film 7 is formed on the drift layer 2 as a bridge between peripheral portions of the right and left well regions 3 adjacent to the well region 13. The gate electrode 103 is provided on the gate insulating film 7. The gate electrode 103 is provided over the drift layer 2, the well region 3, the well region 13, the well contact region 15, and a peripheral portion of the source region 4. While the source contact 16 is provided in such a manner as to contact a part of the well contact region 15 in FIG. 2, this source contact 16 is not formed in the section along the line B-B.

An n-type or p-type epitaxial layer may be epitaxially grown to a thickness from 10 to 500 nm on the drift layer 2, and an epitaxial channel layer in which a channel is to be formed may be formed in the epitaxial layer. However, as this is not an essential structure, so that description and illustration thereof will be omitted in the present disclosure.

FIG. 4 is a schematic view explaining effect by the n-type silicon carbide MOSFET 100 of the first embodiment. Here, Cgs is a capacitance between the gate electrode 103 and the source electrode 101 (hereinafter called a gate-to-source capacitance), Cgd is a capacitance between the gate electrode 103 and the drain electrode 102 (hereinafter called a gate-to-drain capacitance), Cds is a capacitance between the drain electrode 102 and the source electrode 101 (hereinafter called a drain-to-source capacitance), Cgp is a capacitance between the gate electrode 103 and the well region 13 (hereinafter called a gate-to-well capacitance), and Cdp is a capacitance between the drain electrode 102 and the well region 13 (hereinafter called a drain-to-well capacitance). Furthermore, Rp is a resistive component in the well region 13, ρa is a contact resistance with the well contact region 5, and ρd is a contact resistance with the well contact region 15. As shown in FIG. 4, a region including the well region 13 will be called a dummy region and a region other than the dummy region will be called a transistor region.

FIG. 5 is an equivalent circuit diagram of the transistor region. For the sake of convenience, the contact resistance ρa is omitted.

FIG. 6 is an equivalent circuit diagram showing the transistor region and the dummy region in combination. For the sake of convenience, the contact resistances ρa and ρd are omitted.

FIG. 7 is an equivalent circuit diagram in the case of switching the MOSFET 100 in FIG. 6 at low speed. The gate-to-well capacitance Cgp is omitted from FIG. 6. During the switching, the drain-to-well capacitance Cdp is charged and discharged to generate a displacement current in the well region 13. In this regard, as the gate-to-well capacitance Cgp in FIG. 6 has a sufficiently high impedance during the switching at low speed, the displacement current mainly flows through the resistive component Rp in the well region 13 into the source electrode 101.

FIG. 8 is an equivalent circuit diagram in the case of switching the MOSFET 100 in FIG. 6 at high speed. The resistive component Rp in the well region 13 in FIG. 6 is omitted. During the switching, the drain-to-well capacitance is charged and discharged to generate a displacement current in the well region 13. In this regard, as the gate-to-well capacitance Cgp in FIG. 6 has an impedance sufficiently lower than Rp during the switching at high speed, the displacement current mainly flows through Cgp into the gate electrode 103. Specifically, during the high-speed switching, capacitive coupling between the drain electrode 102 and the gate electrode 103 is increased effectively compared to that during the low-speed switching.

FIG. 9 shows simulation result about the dependence of the gate-to-drain capacitance Cgd on a drain voltage in a normal MOSFET without a dummy region. In FIG. 9, a horizontal axis shows a drain voltage Vds (V) and a vertical axis shows the gate-to-drain capacitance Cgd (nF/cm$^2$).

FIG. 9 shows characteristics at switching frequencies of 10 MHz, 100 MHz, and 1 GHz indicated by a solid line, a dash-dotted line, and a dashed line respectively. As understood from FIG. 9, the gate-to-drain capacitance Cgd takes a value around 0.1 nF/cm$^2$.

Figure 10:
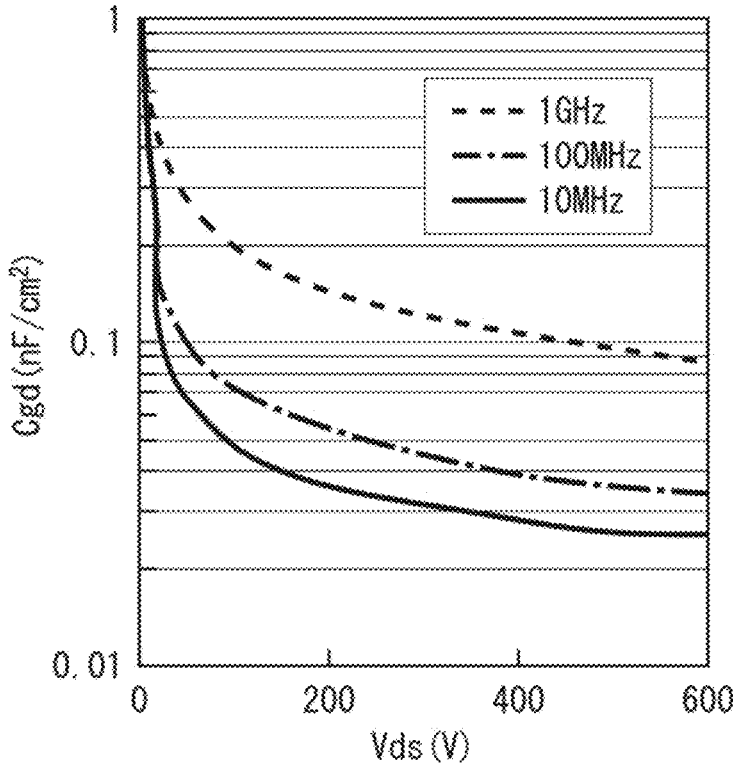
FIG. 10 explains effect by the silicon carbide semiconductor device according to the first embodiment.

FIG. 10 shows simulation result about the dependence of the gate-to-drain capacitance Cgd on a drain voltage in the n-type silicon carbide MOSFET 100 with a dummy region. In FIG. 10, a horizontal axis shows the drain voltage Vds (V) and a vertical axis shows the gate-to-drain capacitance Cgd (nF/cm$^2$). FIG. 10 shows characteristics at switching frequencies of 10 MHz, 100 MHz, and 1 GHz indicated by a solid line, a dash-dotted line, and a dashed line respectively. In conducting this simulation, the contact resistances ρa and ρd are set to have the same value by designing the well region 3 and the well region 13 and by designing the well contact region 5 and the well contact region 15.

Making comparison between FIGS. 9 and 10 shows that, while the gate-to-drain capacitances Cgd are substantially equal between FIGS. 9 and 10 at a high frequency, namely, at 1 GHz, Cgd becomes lower in FIG. 10 at low frequencies, namely, at 10 MHz and 100 MHz.

If the gate-to-drain capacitance Cgd is high at a high frequency, voltage fluctuation of a high-frequency component is suppressed to suppress gate-to-source voltage oscillation, making it possible to reduce electromagnetic noise. If the gate-to-drain capacitance Cgd is high at a low frequency, switching loss increases. Specifically, the comparison between FIGS. 9 and 10 shows that, by using the n-type silicon carbide MOSFET 100 of the first embodiment, it is possible to reduce switching loss while electromagnetic noise is controlled substantially equally. In other words, it is possible to suppress increase in switching loss and suppress gate-to-source voltage fluctuation, so that electromagnetic noise can be reduced.

First Modification

FIG. 11 is a plan view schematically showing the configuration of an n-type silicon carbide MOSFET 101 according to a first modification of the first embodiment. FIG. 12 is a sectional view taken in an arrow direction along a line A-A in FIG. 11 and schematically showing the configuration of a unit cell. FIG. 13 is a sectional view taken in an arrow direction along a line B-B in FIG. 11 and schematically showing the configuration of a unit cell.

As shown in FIG. 2, in the n-type silicon carbide MOSFET 100, the well contact region 5 and the source region 4 contact the source contact 6 in the same section. Meanwhile, in the n-type silicon carbide MOSFET 101 shown in FIGS. 11, 12, and 13, the well contact region 5 is formed discontinuously in the source region 4 in a direction in which the well region 3 extends (y direction) to define a configuration in which the well contact region 5 and the source region 4 are present in a staggered manner in the extending direction of the well region 3 and a configuration in which each of the well contact region 5 and the source region 4 contacts the source contact 6. Even with this configuration, it is still possible to suppress increase in switching loss to allow reduction in electromagnetic noise.

Second Modification

FIG. 14 is a sectional view schematically showing the configuration of an n-type silicon carbide MOSFET 102 according to a second modification of the first embodiment. This sectional view corresponds to the sectional view taken in the arrow direction along the line A-A shown in FIG. 1. In the configuration of the n-type silicon carbide MOSFET 100 shown in FIGS. 1 and 2, only the well contact region 15 is provided in the well region 13. Meanwhile, in the configuration of the n-type silicon carbide MOSFET 102 shown in FIG. 14, an n-type impurity region 14 (second impurity region) having a smaller area in a plan view than the source region 4 is provided in the well region 13. Employing this configuration achieves the effect of reducing an ON resistance. Meanwhile, even in the presence of an MOSFET formed in the well region 13 by the provision of the impurity region 14, the presence of the gate-to-drain capacitance Cgd and the gate-to-well capacitance Cgp in a part without an n-type region in the well region 13 with respect to a total of an area in which an MOSFET is formed in the well region 3 and an area in which the MOSFET is formed partially in the well region 13 still achieves the effect of reducing electromagnetic noise, like in a configuration without an n-type region in the well region 13.

Preferably, like in the source region 4, an impurity concentration of the n-type impurity in the impurity region 14 is equal to or greater than $1.0 \times 10^{17}$ cm$^{-3}$ and equal to or less than $1.0 \times 10^{21}$ cm$^{-3}$.

Second Embodiment

FIG. 15 is a plan view schematically showing the configuration of an n-type silicon carbide MOSFET 200 of a second embodiment according to the present disclosure. FIG. 16 is a sectional view taken in an arrow direction along a line B-B in FIG. 15 and schematically showing the configuration of a unit cell. A sectional view taken in an arrow direction along a line A-A in FIG. 15 is the same as that shown in FIG. 2.

As shown in FIG. 15, in the n-type silicon carbide MOSFET 200, the well contact region 15 is not formed over an entire length of the well region 13 in the extending direction but the well contact region 15 is formed partially along the length of the well region 13, and the source contact 16 is formed only in a part in the presence of the well contact region 15. Thus, as shown in FIG. 16, it is possible to increase an area under the gate electrode 103 in which the well contact region 15 is not formed. This allows increase in the resistive component Rp in the well region 13 and allows further increase in the capacitive coupling between the drain electrode 102 and the gate electrode 103 in a high-frequency region, so that the effect of reducing electromagnetic noise can be improved.

Third Embodiment

FIG. 17 is a sectional view schematically showing the configuration of an n-type silicon carbide MOSFET 300 of a third embodiment according to the present disclosure and is a sectional view corresponding to the sectional view taken in the arrow direction along the line A-A in FIG. 1.

In the n-type silicon carbide MOSFET 300 shown in FIG. 17, a well region 131 forming a dummy region has an impurity concentration lower than the impurity concentration in the well region 3 forming a transistor region.

Thus, it is possible to increase the resistive component Rp in the well region 13 and to increase the capacitive coupling between the drain electrode 102 and the gate electrode 103 in a high-frequency region further, so that the effect of reducing electromagnetic noise can be improved.

The impurity concentration in the well region 131 may be lower than the impurity concentration in the well region 3 only slightly. Reducing the impurity concentration in a range from several percent to about ten percent is sufficient for achieving the effect.

By increasing the resistive component Rp in the well region 131, it is possible to increase a resistance in the source contact 16 in a part in which the well region 131 faces the gate electrode 103. This makes it possible to increase the capacitive coupling between the drain electrode 102 and the gate electrode 103 further in a high-frequency region, so that the effect of reducing electromagnetic noise can be improved.

Fourth Embodiment

FIG. 18 is a plan view schematically showing the configuration of an n-type silicon carbide MOSFET 400 of a fourth embodiment according to the present disclosure.

In the n-type silicon carbide MOSFET 400 shown in FIG. 18, the width of the well region 13, specifically, the length of the well region 13 in a direction in which the well region 3 and the well region 13 are arranged (x direction) is set less than the width of the well region 3.

The width of the well region 13 may be less than the width of the well region 3 only slightly. Reducing the width of the well region 13 in a range from several percent to about ten percent is sufficient for achieving the effect.

By reducing the width of the well region 13, it becomes possible to increase the resistive component Rp in the well region 13 and to increase the capacitive coupling between the drain electrode 102 and the gate electrode 103 in a high-frequency region further, so that the effect of reducing electromagnetic noise can be improved.

Fifth Embodiment

Figure 19:
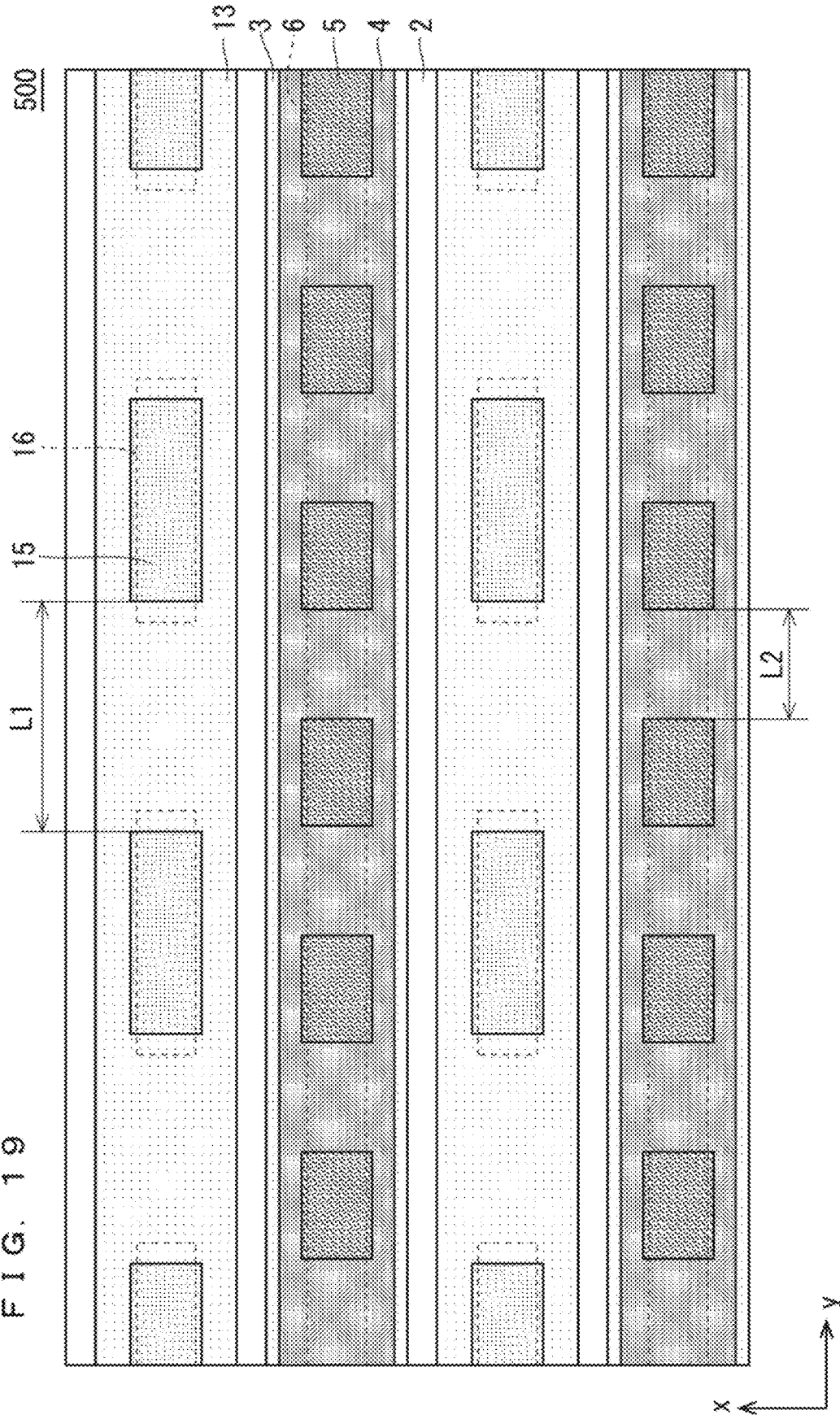
FIG. 19 is a plan view schematically showing the configuration of a silicon carbide semiconductor device according to a fifth embodiment.

FIG. 19 is a plan view schematically showing the configuration of an n-type silicon carbide MOSFET 500 of a fifth embodiment according to the present disclosure.

In the n-type silicon carbide MOSFET 500 shown in FIG. 19, the well contact region 5 is formed discontinuously in the source region 4 in a direction in which the well region 3 extends (y direction) to define a configuration in which the well contact region 5 and the source region 4 are present in a staggered manner in the extending direction of the well region 3. Furthermore, the well contact region 15 is formed discontinuously in a direction in which the well region 13 extends (y direction), and a region interval L1 between the well contact regions 15 is set greater than a region interval L2 between the well contact regions 5.

By employing this configuration, a path length of a displacement current flowing from the well region 13 into the source electrode 101 through the well contact region 15 is set greater than a path length of a displacement current flowing from the well region 3 into the source electrode 101 through the well contact region 5.

Figure 20:
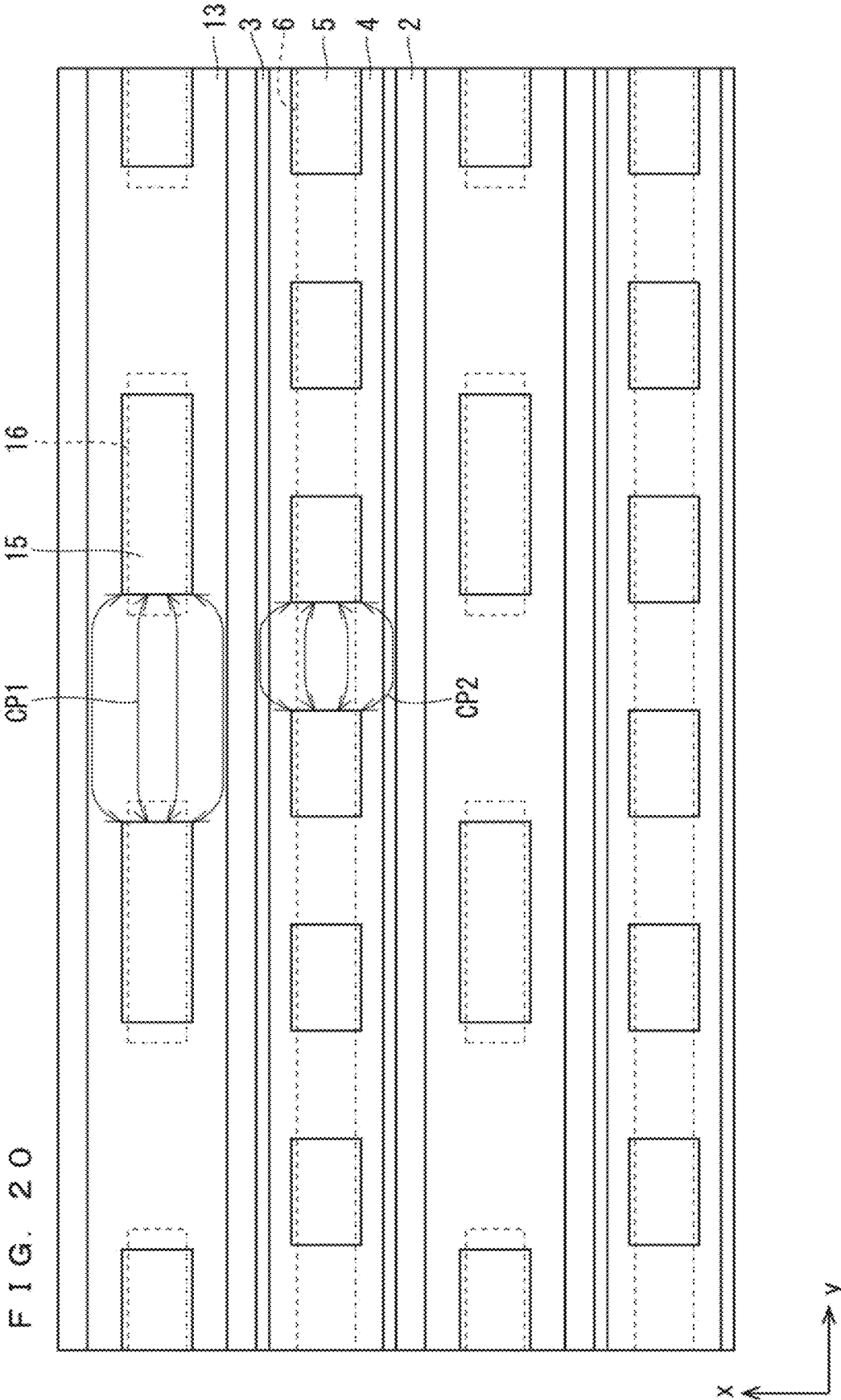
FIG. 20 schematically shows a path of a displacement current in the silicon carbide semiconductor device according to the fifth embodiment.

FIG. 20 schematically shows a path of a displacement current, and shows a path CP1 of a displacement current flowing from the well region 13 into the source electrode 101 through the well contact region 15 and a path CP2 of a displacement current flowing from the well region 3 into the source electrode 101 through the well contact region 5.

Setting the region interval L1 between the well contact regions 15 greater than the region interval L2 between the well contact regions 5 makes the path CP1 greater than the path CP2. By doing so, it becomes possible to increase the resistive component Rp in the well region 13 and to increase the capacitive coupling between the drain electrode 102 and the gate electrode 103 in a high-frequency region further, so that the effect of reducing electromagnetic noise can be improved.

Sixth Embodiment

FIG. 21 is a sectional view schematically showing the configuration of an n-type silicon carbide MOSFET 600 of a sixth embodiment according to the present disclosure and is a sectional view corresponding to the sectional view taken in the arrow direction along the line B-B in FIG. 1. While the well contact region 15 is omitted from FIG. 21 for the sake of convenience, the presence or absence of the well contact region 15 does not influence effect achieved by the present embodiment.

In the n-type silicon carbide MOSFET 600 shown in FIG. 21, a well region 132 has a sectional shape that is a projecting shape partially projecting toward the drain electrode 102.

Employing this configuration makes it possible to increase the area of a pn junction interface between the well region 13 and the drift layer 2. This makes it possible to increase the drain-to-well capacitance Cdp and to increase the capacitive coupling between the drain electrode 102 and the gate electrode 103 in a high-frequency region further, so that the effect of reducing electromagnetic noise can be improved.

Seventh Embodiment

Figure 22:
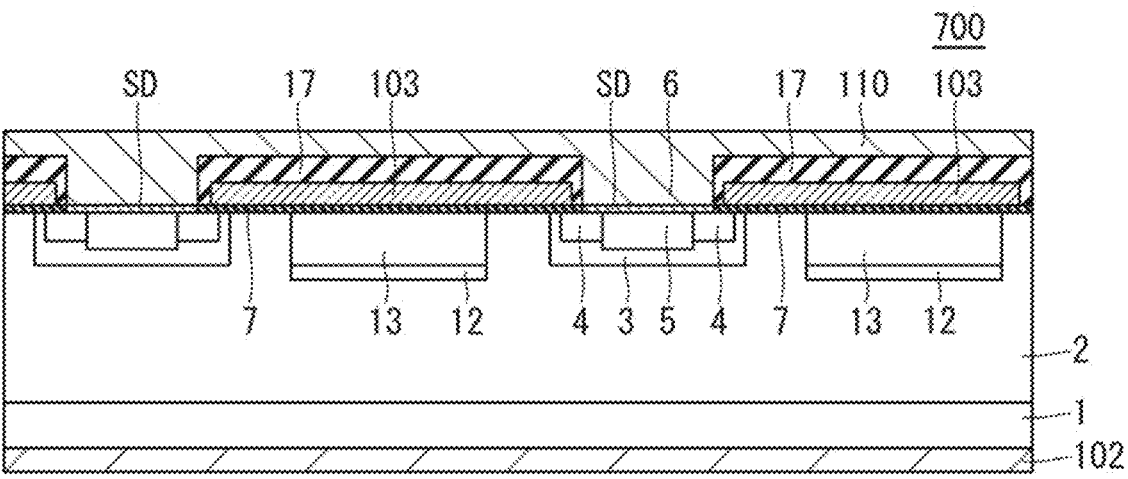
FIG. 22 is a sectional view schematically showing the configuration of a silicon carbide semiconductor device according to a seventh embodiment.

FIG. 22 is a sectional view schematically showing the configuration of an n-type silicon carbide MOSFET 700 of a seventh embodiment according to the present disclosure and is a sectional view corresponding to the sectional view taken in the arrow direction along the line B-B in FIG. 1. While the well contact region 15 is omitted from FIG. 22 for the sake of convenience, the presence or absence of the well contact region 15 does not influence effect achieved by the present embodiment.

In the n-type silicon carbide MOSFET 700 shown in FIG. 22, an impurity region 12 (third impurity region) having a relatively high concentration of the n-type impurity is provided directly under the well region 13. Preferably, the impurity concentration in the impurity region 12 is lower than the impurity concentration of the p-type impurity in the well region 13. This is intended to cause a depletion layer resulting from a pn junction formed between the impurity region 12 and the well region 13 to extend further toward the impurity region 12.

The impurity concentration in the impurity region 12 is set higher than the impurity concentration of the n-type impurity in the drift layer 2. This allows increase in the drain-to-well capacitance Cdp and allows further increase in the capacitive coupling between the drain electrode 102 and the gate electrode 103 in a high-frequency region, so that the effect of reducing electromagnetic noise can be improved.

Modification

FIG. 23 is a sectional view schematically showing the configuration of an n-type silicon carbide MOSFET 701 according to a modification of the seventh embodiment. In the n-type silicon carbide MOSFET 701 shown in FIG. 23, the impurity region 12 is provided not only directly under the well region 13 but also between the impurity regions formed in the upper layer part of the drift layer 2 and also directly under each of these impurity regions.

Preferably, in this case, the impurity concentration in the impurity region 12 is set lower than the impurity concentration in the well region 3. This is intended to cause a depletion layer resulting from a pn junction formed between the impurity region 12 and the well region 3 to extend further toward the impurity region 12.

As a result, it is possible to increase the drain-to-well capacitance Cdp and to increase the capacitive coupling between the drain electrode 102 and the gate electrode 103 in a high-frequency region further, so that the effect of reducing electromagnetic noise can be improved.

Eighth Embodiment

FIG. 24 is a sectional view schematically showing the configuration of an n-type silicon carbide MOSFET 800 of an eighth embodiment according to the present disclosure and is a sectional view corresponding to the sectional view taken in the arrow direction along the line B-B in FIG. 1. While the well contact region 15 is omitted from FIG. 24 for the sake of convenience, the presence or absence of the well contact region 15 does not influence effect achieved by the present embodiment.

In the n-type silicon carbide MOSFET 800 shown in FIG. 24, the gate insulating film 7 is formed on the drift layer 2 as a bridge between peripheral portions of the right left well regions 3 adjacent to the well region 13, and the gate electrode 103 is provided on the gate insulating film 7. The gate electrode 103 is provided over the drift layer 2, the well region 3, the well region 13, the well contact region 15, and a peripheral portion of the source region 4. Meanwhile, as shown in FIG. 24, the gate electrode 103 provided over the drift layer 2 has a part 1031 (first part) extending over the well region 3 and a part 1032 (second part) extending over the well region 13, and the part 1031 and the part 1032 are separated from each other.

By employing this configuration, it becomes possible to increase the ratio of a gate-to-well capacitance to the gate-to-drain capacitance Cgd and to increase the capacitive coupling between the drain electrode 102 and the gate electrode 103 in a high-frequency region further, so that the effect of reducing electromagnetic noise can be improved.

Ninth Embodiment

FIG. 25 is a plan view schematically showing the configuration of an n-type silicon carbide MOSFET 900 of a ninth embodiment according to the present disclosure.

In the n-type silicon carbide MOSFET 900 shown in FIG. 25, a forming ratio per unit area in a plan view between the well region 3 forming a transistor region and the well region 13 forming a dummy region is 2 to 1, not 1 to 1 shown in FIG. 1. Specifically, in this configuration, two well regions 3 are formed adjacent to each other and one well region 13 is formed between the two well regions 3 adjacent to each other.

Employing this configuration makes it possible to increase a transistor region to enhance a function as an MOSFET. Furthermore, forming a dummy region suppresses increase in switching loss to also achieve the effect of reducing electromagnetic noise.

While a forming ratio per unit area between the well region 3 and the well region 13 is 2 to 1 in FIG. 25, this forming ratio is arbitrarily settable to allow a forming ratio per unit area between a transistor region and a dummy region to be designed arbitrarily. As a result, it is possible to determine the effect of reducing switching loss and the effect of reducing electromagnetic noise arbitrarily. By increasing the ratio of a dummy region, the effect of reducing electromagnetic noise can be improved further.

Arbitrarily setting a forming ratio per unit area between the well region 3 and the well region 13 is applicable to any of the n-type silicon carbide MOSFETs 200 to 800 according to the second to eighth embodiments.

Tenth Embodiment

FIG. 26 is a plan view schematically showing the configuration of an n-type silicon carbide MOSFET 1000 of a tenth embodiment according to the present disclosure.

In the n-type silicon carbide MOSFET 1000 shown in FIG. 26, the source region 4 is formed discontinuously in a direction in which the well region 3 extends (y direction).

By employing this configuration, it becomes possible to determine a trade-off relationship arbitrarily between ON characteristics and voltage withstand of an MOSFET. Specifically, providing a part without the source region 4 makes it possible to enhance voltage withstand and providing a part with the source region 4 makes it possible to improve the ON characteristics of the MOSFET. Thus, by adjusting a ratio between the part without the source region 4 and the part with the source region 4, it becomes possible to arbitrarily determine a trade-off relationship between the ON characteristics and voltage withstand of the MOSFET.

<Characteristic Improvement Using Contact Resistance>

In the first to tenth embodiments, the well contact region 5 and the well contact region 15 have the same impurity concentration of the p-type impurity. In this case, a contact resistivity ($\Omega$cm$^2$) is the same between the well contact region 5 and the well contact region 15. Thus, by making an opening area at the source contact 16 smaller than an opening area at the source contact 6 as shown in FIG. 1, for example, it becomes possible to make a contact resistance in the well contact region 15 higher than a contact resistance in the well contact region 5.

Thus, it is possible to increase the contact resistance $\rho d$ with the well contact region 15 (FIG. 4) and to increase the capacitive coupling between the drain electrode 102 and the gate electrode 103 in a high-frequency region further, so that the effect of reducing electromagnetic noise can be improved.

Whether a displacement current generated in the well region 13 is to flow into the source electrode 101 or into the gate electrode 103 is determined by a magnitude relationship between an impedance of a resistive component and an impedance of a capacitive component relative to each other, as described above. Specifically, increasing the contact resistance $\rho d$ fulfills effect comparable to that fulfilled by increasing the resistive component Rp in the well region 13 in the first embodiment.

<Characteristic Improvement Using Contact Resistivity>

In the first to tenth embodiments, the well contact region 5 and the well contact region 15 have the same impurity concentration of the p-type impurity and also have the same contact resistivity ($\Omega$cm$^2$). Meanwhile, a contact resistivity in the source contact 16 to the well contact region 15 can be set higher than a contact resistivity in the source contact 6 to the well contact region 5.

As an example, this setting may be achieved by making an impurity concentration of the p-type impurity in a topmost surface of the well contact region 15 lower than an impurity concentration of the p-type impurity in a topmost surface of the well contact region 5. This may be realized by a method of determining a smaller amount of dose into the well contact region 15 at the same implantation energy, for example.

The foregoing setting may also be achieved by determining a different overetching amount during formation of an opening for the source contact 16 from an overetching amount during formation of an opening for the source contact 6 to change a height position between the topmost surfaces of the well contact region 15 and the well contact region 5, thereby making an impurity concentration in the topmost surface of the well contact region 15 lower than an impurity concentration in the topmost surface of the well contact region 5. Specifically, during impurity introduction into the well contact region 15 and the well contact region 5, the impurity is introduced at the same implantation energy and at the same dose amount. An impurity concentration may be low in the vicinity of a surface of an impurity region. Then, by setting an overetching amount during formation of the opening for the source contact 16 smaller than an overetching amount during formation of the opening for the source contact 6, it becomes possible to make an impurity concentration in the topmost surface of the well contact region 15 lower than an impurity concentration in the topmost surface of the well contact region 5.

By doing so, it becomes possible to increase the contact resistance $\rho d$ in the well contact region 15 and to increase the capacitive coupling between the drain electrode 102 and the gate electrode 103 in a high-frequency region further, so that the effect of reducing electromagnetic noise can be improved.

A switching element composed of silicon carbide semiconductor causes low power loss and has high resistance to heat. For this reason, in forming a power module with a cooling unit, a heat dissipation fin of a heat sink can be reduced in size, making it possible to achieve further size reduction of a semiconductor module.

A switching element composed of silicon carbide semiconductor is suitable for high-frequency switching operation. Thus, if this switching element is employed in a converter circuit largely required to achieve higher frequency, a higher switching frequency is achieved, thereby allowing size reduction of a reactor or a capacitor, for example, to be connected to the converter circuit.

While the present disclosure has been described in detail, the foregoing description is in all aspects illustrative and the present disclosure is not limited to this description. It is therefore understood that numerous modifications not shown can be devised without departing from the scope of the present disclosure.

The embodiments of the present disclosure can be combined freely or each of the embodiments can be modified or omitted, if appropriate, within a range of the disclosure.

The invention claimed is:

1. A silicon carbide semiconductor device in which a main current flows in a thickness direction of a silicon carbide substrate, comprising:

a semiconductor layer of a first conductivity type provided on a first main surface of the silicon carbide substrate;

a first well region of a second conductivity type provided in an upper layer part of the semiconductor layer and having a stripe shape extending in a first direction;

a first impurity region of the first conductivity type provided in an upper layer part of the first well region;

at least one first well contact region of the second conductivity type provided in the upper layer part of the first well region and having a side surface joined to the first impurity region;

a first contact electrically connected to the first impurity region and the at least one first well contact region and electrically connected to a first main electrode provided over the semiconductor layer;

a second well region of the second conductivity type having a stripe shape separated from the first well region in a second direction perpendicular to the first direction, extending in the first direction, and having no impurity region of the first conductivity type inside the second well region;

at least one second well contact region of the second conductivity type provided in an upper layer part of the second well region;

a second contact electrically connected to the at least one second well contact region and electrically connected to the first main electrode provided over the semiconductor layer; and a second main electrode provided on a second main surface of the silicon carbide substrate on an opposite side to the first main surface, wherein in an area in which the first well region and the second well region are adjacent to each other, a gate electrode is provided across a gate insulating film provided on a peripheral portion of the first impurity region, on the first well region, on the semiconductor layer, and on a peripheral portion of the second well region.

2. The silicon carbide semiconductor device according to claim 1, wherein the at least one second well contact region is absent in a part without the second contact on the second well region.

3. The silicon carbide semiconductor device according to claim 1, wherein the at least one first well contact region includes a plurality of the first well contact regions separated from each other in the first direction and the at least one second well contact region includes a plurality of the second well contact regions separated from each other in the first direction, and an interval between the second well contact regions adjacent to each other is greater than an interval between the first well contact regions adjacent to each other.

4. The silicon carbide semiconductor device according to claim 1, further comprising:

a third impurity region of the first conductivity type provided at least directly under the second well region, having a higher impurity concentration than the semiconductor layer, and having a lower impurity concentration than the second well region.

5. The silicon carbide semiconductor device according to claim 1, wherein in an area in which the first well region and the second well region are adjacent to each other and in which the second contact is absent, the gate electrode is separated into a first part extending from over the semiconductor layer to the first well region and the peripheral portion of the first impurity region and a second part extending from over the semiconductor layer to the second well region.

6. The silicon carbide semiconductor device according to claim 1, wherein the first well region and the second well region are formed at different forming ratios per unit area in a plan view.

7. The silicon carbide semiconductor device according to claim 1, wherein the first impurity region is formed discontinuously in the first direction.

8. The silicon carbide semiconductor device according to claim 1, wherein a contact resistance in the second contact with the at least one second well contact region is higher than a contact resistance in the first contact with the at least one first well contact region.

9. The silicon carbide semiconductor device according to claim 1, wherein the at least one first well contact region is provided in a stripe shape in the first direction, and the at least one second well contact region is provided locally.

10. A silicon carbide semiconductor device in which a main current flows in a thickness direction of a silicon carbide substrate, comprising:

a semiconductor layer of a first conductivity type provided on a first main surface of the silicon carbide substrate;

a first well region of a second conductivity type provided in an upper layer part of the semiconductor layer and having a stripe shape extending in a first direction;

a first impurity region of the first conductivity type provided in an upper layer part of the first well region;

at least one first well contact region of the second conductivity type provided in the upper layer part of the first well region and having a side surface joined to the first impurity region;

a first contact electrically connected to the first impurity region and the at least one first well contact region and electrically connected to a first main electrode provided over the semiconductor layer;

a second well region of the second conductivity type having a stripe shape separated from the first well region in a second direction perpendicular to the first direction and extending in the first direction;

at least one second well contact region of the second conductivity type provided in an upper layer part of the second well region;

a second impurity region of the first conductivity type provided in the upper layer part of the second well region, joined to a side surface of the at least one second well contact region, and having an area smaller than that of the first impurity region in a plan view;

a second contact electrically connected to the at least one second well contact region and electrically connected to the first main electrode provided over the semiconductor layer; and a second main electrode provided on a second main surface of the silicon carbide substrate on an opposite side to the first main surface, wherein in an area in which the first well region and the second well region are adjacent to each other, a gate electrode is provided across a gate insulating film provided on a peripheral portion of the first impurity region, on the first well region, on the semiconductor layer, and on a peripheral portion of the second well region.

11. The silicon carbide semiconductor device according to claim 10, wherein the at least one second well contact region is absent in a part without the second contact on the second well region.

12. The silicon carbide semiconductor device according to claim 10, wherein the at least one first well contact region includes a plurality of the first well contact regions separated from each other in the first direction and the at least one second well contact region includes a plurality of the second well contact regions separated from each other in the first direction, and an interval between the second well contact regions adjacent to each other is greater than an interval between the first well contact regions adjacent to each other.

13. The silicon carbide semiconductor device according to claim 10, further comprising:

a third impurity region of the first conductivity type provided at least directly under the second well region, having a higher impurity concentration than the semiconductor layer, and having a lower impurity concentration than the second well region.

14. The silicon carbide semiconductor device according to claim 10, wherein in an area in which the first well region and the second well region are adjacent to each other and in which the second contact is absent, the gate electrode is separated into a first part extending from over the semiconductor layer to the first well region and the peripheral portion of the first impurity region and a second part extending from over the semiconductor layer to the second well region.

15. The silicon carbide semiconductor device according to claim 10, wherein the first well region and the second well region are formed at different forming ratios per unit area in a plan view.

16. The silicon carbide semiconductor device according to claim 10, wherein the first impurity region is formed discontinuously in the first direction.

17. The silicon carbide semiconductor device according to claim 10, wherein a contact resistance in the second contact with the at least one second well contact region is higher than a contact resistance in the first contact with the at least one first well contact region.

18. The silicon carbide semiconductor device according to claim 10, wherein the at least one first well contact region is provided in a stripe shape in the first direction, and the at least one second well contact region is provided locally.

\* \* \* \* \*